(12) United States Patent
Lagarec et al.

(10) Patent No.: US 8,093,567 B2
(45) Date of Patent: Jan. 10, 2012

(54) METHOD AND SYSTEM FOR COUNTING SECONDARY PARTICLES

(75) Inventors: Ken Guillaume Lagarec, Gatineau (CA); Michael William Phaneuf, Ottawa (CA)

(73) Assignee: Fibics Incorporated, Ottawa, Ontario (CA)

( * ) Notice: Subject to any disclaimer, the term of this patent is extended or adjusted under 35 U.S.C. 154(b) by 0 days.

(21) Appl. No.: 12/374,426

(22) PCT Filed: Jul. 23, 2007

(86) PCT No.: PCT/CA2007/001304
§ 371 (c)(1),
(2), (4) Date: Dec. 9, 2009

(87) PCT Pub. No.: WO2008/009139
PCT Pub. Date: Jan. 24, 2008

(65) Prior Publication Data
US 2010/0084568 A1 Apr. 8, 2010

Related U.S. Application Data

(60) Provisional application No. 60/820,004, filed on Jul. 21, 2006.

(51) Int. Cl.
*H01J 37/147* (2006.01)
*H01J 37/00* (2006.01)

(52) U.S. Cl. .................. 250/492.21; 250/306; 250/309; 250/492.1

(58) Field of Classification Search .................. 250/306, 250/309, 492.1, 492.21
See application file for complete search history.

(56) References Cited

U.S. PATENT DOCUMENTS

| | | | | |
|---|---|---|---|---|
| 3,829,838 | A * | 8/1974 | Lewis et al. | 345/419 |
| 4,443,278 | A * | 4/1984 | Zingher | 156/64 |
| 5,149,976 | A * | 9/1992 | Sipma | 250/492.2 |
| 5,331,161 | A * | 7/1994 | Ohdomari et al. | 850/63 |
| 5,434,422 | A * | 7/1995 | Iwamoto et al. | 250/491.1 |
| 5,729,584 | A | 3/1998 | Moorman et al. | |
| 6,232,787 | B1 * | 5/2001 | Lo et al. | 324/754.22 |
| 6,649,919 | B2 * | 11/2003 | Chao et al. | 250/492.2 |
| 6,911,832 | B2 * | 6/2005 | Kolachina et al. | 324/754.21 |
| 6,941,006 | B1 * | 9/2005 | Penberth et al. | 382/141 |
| 6,964,378 | B2 * | 11/2005 | Taddiken | 235/492 |

(Continued)

OTHER PUBLICATIONS

PCT Patent Application No. PCT/CA2007/001304, ISR dated Nov. 2, 2007.

*Primary Examiner* — David A Vanore
(74) *Attorney, Agent, or Firm* — Mukundan Chakrapani; Borden Ladner Gervais LLP

(57) ABSTRACT

An apparatus for visualizing an ion beam editing operation of a sample. The apparatus comprises a charged particle beam column for producing an charged particle beam and for directing the charged particle beam onto the sample and beam rastering electronics (BRE) for controlling a movement and a dwell time of the charged particle beam. The apparatus further comprises a detector for detecting charged particles stemming from the sample as a result of the charged particle beam impinging on the sample and a multi-channel scalar (MCS) coupled to the detector and to the IBRE, and time-correlated with the BRE, the MCS for binning events detected at the detector as a function of time duration from a start event. Finally, the apparatus comprises an analysis module connected to the MCS for processing data from the MCS into a display signal, and a display module connected to the analysis module for displaying the display signal.

25 Claims, 6 Drawing Sheets

U.S. PATENT DOCUMENTS

| | | | |
|---|---|---|---|
| 7,351,983 B2 * | 4/2008 | Sakaguchi | 250/396 R |
| 7,485,873 B2 * | 2/2009 | Ward et al. | 250/423 F |
| 7,696,495 B2 * | 4/2010 | Mack et al. | 250/492.21 |
| 7,739,193 B2 * | 6/2010 | Zimmer et al. | 705/40 |
| 7,804,068 B2 * | 9/2010 | Notte, IV | 250/309 |
| 7,883,999 B2 * | 2/2011 | Shao et al. | 438/519 |

* cited by examiner

METHOD AND SYSTEM FOR COUNTING SECONDARY PARTICLES

FIELD OF THE INVENTION

The present invention relates generally to the detection of electrically charged particles generated by a charged particle beam impinging on a target material. More particularly, the present invention relates to imaging a material surface using a rastered beam system.

BACKGROUND OF THE INVENTION

Focused Ion Beam (FIB) microscope systems have been produced commercially since the mid 1980's, and are now an integral part of rapidly bringing semiconductor devices to market. FIB systems produce a narrow, focused beam of charged particles, and scan this beam across a specimen in a raster fashion, similar to a cathode ray tube. Unlike the scanning electron microscope, whose charged particles are negatively charged electrons, FIB systems use charged atoms, hereinafter referred to as ions, to produce their beams. These ions are, in general, positively charged.

These ion beams, when directed onto a semiconductor sample, will eject charged particles, which include secondary electrons, secondary ions ($i^+$ or $i^-$), and neutral molecules and atoms from the exposed surface of the sample. By moving the beam across the sample and controlling various beam parameters such as beam current, spot size, pixel spacing, and dwell time, the FIB can be operated as an "atomic scale milling machine," for selectively removing, or sputtering, materials wherever the beam is placed. The dose, or amount of ions striking the sample surface, is generally a function of the beam current, duration of scan, and the area scanned. The ejected particles can be sensed by detectors, and then by correlating this sensed data with the known beam position as the incident beam interacts with the sample, an image can be produced and displayed for the operator.

FIG. 1 is a schematic of a typical FIB system. FIB system 10 includes an evacuated envelope 11 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1\times10E-7$ Torr and $5\times10E-4$ Torr. If an etch assisting gas, an etch retarding gas, a deposition precursor gas, or some other reactive or non reactive gas is used, the chamber background pressure may rise, typically to about $1\times10E-5$ Torr.

High voltage power supply 34 is connected to liquid metal ion source 14 and to appropriate electrodes in focusing column 16 and directing the ion beam. Deflection controller and amplifier 36, operated in accordance with a prescribed pattern provided by pattern generator 38, is coupled to deflection plates 20. A charged particle multiplier detector 40 detects secondary ion or electron emission for imaging, is connected to video circuit and amplifier 42, the latter supplying drive for video monitor 44 and also receiving deflection signals from controller 36. A door 48 is provided for inserting sample 22 onto stage 24, which may be heated or cooled. Focused ion beam systems are commercially available from various companies, but the system shown in FIG. 1 represents one possible FIB system configuration.

FIG. 2 shows a sample surface 60 and a raster area 62 where the ion beam is to be rastered. The raster area 62 is rastered by the ion beam being successively aligned with, for example, the 16 sub-areas A to P for pre-determined dwell times. The raster area 62 is usually an endpointing area to be monitored during the ion beam milling operation. During any beam raster operation executed by FIB system 10, which includes imaging, milling, gas assisted etching or deposition, the FIB beam deflection software and hardware deflects the beam in a preset pattern across the surface. At each preset location (sub-areas A to P for example), the beam is left to dwell for a given period of time before moving to the next point in the raster. At its simplest, a raster pass consists of deflecting the beam at fixed increments along one axis from a start point to an end point, dwelling for a fixed dwell time at each point. At the end of a line, the beam waits a fixed retrace time before moving an increment in a second axis. The beam may return to the start point in the first axis and begin again, or may begin "counting down" the first axis from the point it had just reached (depending on whether the raster type is TV-like (the former) or serpentine (the latter). This process continues until all increments in both axes have occurred, and the beam has dwelled at all points in the scan.

In a FIB system, the rastering of an area on the sample can be much more complex than the standard rastering schemes used by imaging devices. In the examples presented here, a standard TV-like rastering scheme is commonly illustrated, but in general, and in particular for gas-assisted etching, the rastering pattern will not be limited to sequential lines. It can, for example produce alternating frames where the lines are interlaced between successive frames to reduce the depletion of the gas used in the process. Another approach might be to mill alternating frames from top to bottom then bottom to top, thereby completely eliminating the need for blanking the beam if serpentine lines are rastered. It is also possible to mill each frame in a spiral or an interlaced spiral pattern. When combined with specific dwell times which may vary within a frame or within a single dwell location, such specialized rastering patterns will be used for specific reasons related to the rate of removal or deposition of material, ie to produce a uniform depth or height; to minimize or maximize the rate of the density of charge deposited on the sample to avoid charge related problems; to maximize the efficiency of the use of gases in gas-assisted processes; to reduce the amount of deadtime when the beam is blanked and is not actively milling the sample, such as during horizontal and vertical retraces in standard TV-like rasters.

It is well understood by those of skill in the art that FIB systems are used to perform microsurgery operations for executing design verification or to troubleshoot failed designs on integrated circuits. This can involve physically "cutting" metal lines or selectively depositing metallic lines for shorting conductors together. Hence, FIB system technologies can enable prototyping and design verification in a matter of days or hours rather than weeks or months as re-fabrication would require. This FIB "rapid prototyping" is frequently referred to as "FIB device modification", "circuit editing" or "microsurgery." Such FIB operations will be referred to simply as circuit modification. Those skilled in the art should understand that similar operations to add or remove material on specimens other than integrated circuits may also be desireable, and once again for simplicity will be referred to simply as circuit modification. Due to its speed and usefulness, FIB circuit modification has become crucial to achieving the rapid time-to-market targets required in the competitive semiconductor industry.

During an FIB milling operation, charged particles will be ejected from the material. Those skilled in the art should understand that charged particles emanating from a sample bombarded by an ion beam are detected by the detector and converted into a signal (voltage or current) proportional to the number of detected particles. This signal can correspond to a pixel intensity value for the display. Since the gain of the detector, i.e. the proportionality between the number of incident particles and the output signal, can be varied, it is possible for these systems to detect a wide range of signals corresponding to low and high beam currents, which makes them quite suitable for imaging purposes under a multitude of conditions. Typical beam currents that are used range between 100 pA and 1 nA, with dwell times of about 1 micro-second for example. However, as device technologies shrink, the use of lower beam currents in the range of 1 pA and shorter dwell times make these detection systems less effective.

The use of very low incident beam currents is becoming more widely used in back side circuit edit applications in order to slow down milling processes and avoid exposing or damaging active areas on the silicon itself. High aspect ratio holes or trenches are milled with more accuracy by using low beam currents, as the spot size of the beam can be reduced with a reduction of the beam current. By slowing down the process with low beam currents, it is possible to avoid depletion when using gas assisted etching, to use smaller pixel spacings that can provide better spatially resolved images and, most importantly, to give the operator or expert control system the time to make decisions regarding the process. Furthermore, a reduction of the beam current also minimizes exposure of the sample to the beam while imaging between mills.

An inherent result of using low beam currents is the low yield generation of charged particles, such as ions, which are detected and used for imaging the area being rastered by the beam. Low beam currents may eject several charged particles, however re-absorption into the sample will reduce the number of charged particles that can be detected.

Typical ICs include alternating layers of conducting and dielectric materials with many layers containing patterned areas of both. Consequently, the milling rate and effects of ion beam milling can vary vastly across the device. In most circuit edit operations and other FIB operations, it is preferable to stop the milling process as soon as a particular layer is exposed, this is referred to as endpointing. Imprecise endpointing increases the risk of inadvertently either shorting or opening particular circuits of the IC. Consequently, precise endpoint detection during circuit edit operations is desired. Proper endpoint detection is assessed by the FIB operator, who relies on the visual display of the rastered image of the sample surface and/or graphical data relating to a quantitative analysis of the secondary electron yield over time or a dimension of the sample (such as depth for example). Typically, both the displayed image and the quantitative data results from the same signal source, that being the detected particles ejected from the material when the ion beam impinges on the material surface.

This is a significant problem for current FIB systems, since the electronic circuitry used involves analog to digital conversion of the electrical signal generated by the detection of secondary charges. This is a lossy process, particularly prone to noise at low secondary charge currents. The general circuitry configuration includes a biased detector whose output is connected to an amplifier circuit, which is periodically sampled by an analog to digital convertor (ADC). The sampling period will usually correspond to the FIB dwell time for a particular sub-area being rastered.

A problem with the analog to digital conversion scheme is the reliance on a fixed-bandwidth amplification circuit that is used to accumulate the charge corresponding to the number of detected charged particles and amplify it to be used by further electronics downstream. The particle detector will generate a pulse having a characteristic width in response to a detected charged particle. Therefore, within a dwell time of a sub-area, any number of pulses can be generated for the amplifier circuitry. The amplifier can have a bandwidth that is either high or low, each resulting in deficiencies as will be shown in FIGS. 3a and 3b. If the bandwidth of the amplifier is high, the amplifier output signal will change quickly with each incoming pulse. Then the measured value from the discrete sampling of the analog to digital converter (ADC) will be largely dependent on when the sampling is performed compared to when the incoming pulse occurred as shown in FIG. 3a. When a low bandwidth scheme is used, a single incoming pulse results in a longer duration amplified output, but this results in the visual smearing of the image if the ADC sampling is shorter than the amplified pulse duration: the signal due to a pulse during one dwell time extends into the next dwell time, as illustrated in FIG. 3b. In a system such as an FIB system where the dwell time may vary from 50 ns to several microseconds, it is impractical, if not possible, to properly match the amplifier bandwidth to the measurement system.

FIG. 3a is a graphical illustration of the disadvantages of using an amplification circuit with high bandwidth amplification. High bandwidth amplification is relative to the dwell time of the ion beam, and can categorized as such when the bandwidth (BW) is significantly greater than an inverse of the dwell time of the ion beam (BW>>1/dwell time). FIG. 3a is a graphical plot of voltage (V) versus time, with vertical lines 70 illustrating where in time a charged particle is detected, once corrected for time of flight in the system. In order to simply FIG. 3a, only one dashed vertical line is marked with reference number 70. In the present example, the pulses for sub-areas A and B from FIG. 2 are shown. For sub-area A that corresponds to a dwell time from t0 to t1, five charged particles are detected when a low ion beam current is employed. Each of the detected five charged particles are shown by vertical lines 70, the times at which the charged particles' pulses are detected being spread out in time between t0 and t1. The accumulated charge in the amplification circuit is approximated by voltage curve 72, and the ADC samples at time t1. As shown in FIG. 3a, the accumulated charge in the amplification circuit decays before it is sampled, which is an inherent characteristic of the circuit. For sub-area B that corresponds to a dwell time from t1 to t2, five charged particles are also detected. However, these five detected charged particles are grouped in time near the sampling time of t2. Hence the accumulated charge in the amplfication circuit approximated by voltage curve 74 rises as sampling time t2 is approached. Therefore, the ADC will provide a higher value result in comparison to the sampling at time t1, even though five charged particles were detected from the rastering of both sub-areas A and B.

The resulting analog to digital converted value in each sub-area will correspond to a pixel intensity value for the display image of the raster area. Therefore the pixel(s) of a display image corresponding to sub-area A will differ from that of sub-area B while the same number of charged particles is detected. This will adversely affect the image being generated for the operation, thereby reducing accurate endpointing capability.

FIG. 3b is a graphical illustration of the disadvantages of using an amplification circuit with low bandwidth amplification. Low bandwidth amplification is relative to the dwell time of the ion beam, and can be categorized as such when the bandwidth is significantly less than an inverse of the dwell time of the ion beam (BW<<1/dwell time). FIG. 3b is a graphical plot of voltage (V) versus time, with vertical lines 80 illustrating where in time a charged particle is detected for one sub-area of a raster area. In the present example, a single incoming pulse is detected between t0 and t1, for sub-area A. The accumulated charge in the amplification circuit is approximated by voltage curve for 82. If no charged particles are detected between t1 to t2 and t2 to t3, the amplifier output will peak between t1 and t2 in response to the detected charged particle between t0 and t1, and then decay between t2 and t3. Because ADC sampling will occur at t1, t2 and t3 for sub-areas A, B and C respectively, erroneous data is provided since no charged particles were detected between t1 and t2 and t2 and t3.

Those skilled in the art will recognize that there are methods to alleviate this problem, such as oversampling the amplifier output with a clock that has a higher frequency than the dwell clock and displaying the average value as the pixel intensity. For long duration dwell times, it is also possible to electrically integrate the amplifier output over the duration of the dwell time, but this method is technically challenging for the short dwell times commonly used for gas assisted etching. The technique of oversampling has been employed in the Micrion 2500 focused ion beam microscope.

Although methods do exists to improve the sampling and processing of the amplified analog output, there are other sources of noise inherent to the detector that warrant the use of a pulse counting scheme. In particular, it is well known that the amplitude distribution of the detector pulses corresponding to single event detection (characterized as the signal event response or SER) is quite significant. Although this depends on the technology of the detector, it is quite common that the amplitude of the pulse output by a single secondary particle detection be twice as high as for another detection event. This results in additional image noise (spurious intensity variation between pixels) in analog systems that cannot be removed without degrading other valuable image properties.

The detectors that are used for secondary particle detection are also known to have "dark noise" in the form of low amplitude output pulses that are not due to the detection of a secondary particle but rather due to thermal emission of electrons inside the detector, emission of photoelectrons due to cosmic radiation, etc. These pulses would all contribute to a background level in an analog system. In very low incident beam current conditions, since the number of secondary particles produced is low, reducing the background noise is important for improving the image quality. Those skilled in the art will recognize that the problems described previously are well known and characterized for low intensity signals.

Thus, it is desirable to provide a method and system for improving charged particle detection accuracy at low beam currents.

SUMMARY OF THE INVENTION

It is an object of the present invention to obviate or mitigate at least one disadvantage of the prior art. In particular, it is an object of the present invention to improve low beam current FIB charged particle detection accuracy during rastering operations for imaging a material surface.

In a first aspect, the present invention provides a charged particle beam system using a low current charged particle beam for imaging a sample. The charged particle beam system including a beam column, beam rastering electronics, a digital charged particle detection system, and a display engine. The beam column deflects the low current charged particle beam to raster over a predetermined raster area of the sample, in response to control signals. The beam rastering electronics generates the control signals. The digital charged particle detection system counts discrete events arising from a number of detected charged particles ejected from the sample during a dwell time of the low current charged particle beam on each sub-area of the raster area, the digital charged particle detection system providing intensity values corresponding to the discrete events for each sub-area of the raster area. The display engine receives the intensity values and processes the intensity values to generate an image or graph of the raster area on a display for modifying a circuit. The charged particle particle beam system can be a focused ion beam system, and the low current charged beam can be a low current ion beam. According to an embodiment of the present aspect, the digital charged particle system includes a detector and a binning circuit. The detector generates signal pulses corresponding to the number of detected charged particles. The binning circuit counts the signal pulses during the dwell time, the binning circuit providing a total count of the discrete events corresponding to each sub-area of the raster area, where the discrete events are a function of the counted signal pulses. According to further embodiments, the detector can include a multichannel plate detector, a photomultiplier tube, or scintillator for converting the charged particles into photons, and a photomultiplier tube for receiving the photons.

In another embodiment of the present aspect, the binning circuit includes a multi-channel scalar, and the multi-channel scalar includes bins for storing the total count of the signal pulses corresponding to each sub-area. The multi-channel scalar receives the control signals from the beam rastering electronics as a triggering signal for advancing a bin, the control signals being used by the beam column to move the low current charged particle beam to another sub-area. In yet a further embodiment, the binning circuit includes a first multi-channel scalar and a second multi-channel scalar. The first multi-channel scalar detects a first signal pulse having a magnitude between a first threshold and a second threshold, the first multi-channel scalar counting the first signal pulse as one count. The second multi-channel scalar detects a second signal pulse having a magnitude between the second threshold and a third threshold, the third threshold being greater than the second threshold, and the second multi-channel scalar counting the second signal pulse as two counts.

In a second aspect, the present invention provides a method for imaging a raster area of a sample using a charged particle beam system. The method includes directing a low current charged particle beam onto each sub-area of the raster area for a predetermined dwell time; counting a number of charged particles ejected from the sample during the predetermined dwell time for each sub-area; providing intensity values corresponding to the number of counted charged particles for each sub-area of the raster area; and generating a display image of the raster area using the intensity values. The method is executed for a circuit modification operation. According to an embodiment of the present aspect, the step of counting includes detecting the number of charged particles, generating signal pulses corresponding to the number of charged particles, sensing each of the signal pulses, and storing a total number of the signal pulses in a memory bin. The step of storing includes advancing to another memory bin in response to a control signal, the control signal being used by the charged particle beam system to move an charged particle beam to another sub-area. In another embodiment, the step of sensing includes sensing a first signal pulse having a magnitude between a first threshold and a second threshold, and, generating a signal corresponding to a one count when the first signal pulse is detected. The step of sensing further includes sensing a second signal pulse having a magnitude between the second threshold and a third threshold, the third threshold being greater than the second threshold, and generating another signal corresponding to two counts when the second signal pulse is detected.

In a third aspect, the present invention provides a digital charged particle detection system for a charged particle beam system. The system includes a detector and a binning circuit. The detector generates signal pulses in response to one or more detected charged particles ejected from a sample by a low current charged particle beam. The binning circuit counts the signal pulses during a dwell time on each sub-area of a raster area. The binning circuit provides a total count of the signal pulses corresponding to each sub-area. According to embodiments of the present invention, the detector produces a plurality of secondary particles or photons in response to a charged particle, and can include a multichannel plate detector, a photomultiplier tube or a scintillator for converting the charged particles into photons, and a photomultiplier tube for receiving the photons.

In an embodiment of the present aspect, the binning circuit includes a comparator circuit, counting circuitry and memory. The comparator circuit senses the number of signal pulses when each of the signal pulses has a minimum level. The counting circuitry counts the number of signal pulses corresponding to each sub-area of the raster area. The memory stores the total count of the number of signal pulses corresponding to each sub-area in corresponding logical bins. The comparator circuit can include a first comparator and a second comparator. The first comparator detects a first signal pulse having a magnitude between a first threshold and a second threshold, the first comparator generating a signal corresponding to a single count when the first signal pulse is detected. The second comparator detects a second signal pulse having a magnitude between the second threshold and a third threshold, the third threshold being greater than the second threshold. The second comparator generating another signal corresponding to two counts when the second signal pulse is detected. Alternately, the binning circuit can include a multi-channel scalar.

In an embodiment of the present aspect, the binning circuit includes a comparator circuit, counting circuitry and memory. The comparator circuit passes or rejects electrical signal pulses based on whether each of the electrical signal pulses has a minimum threshold level. This process is known as discrimination. The counting circuitry counts the number of discriminated electrical signal pulses corresponding to each sub-area of the raster area.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a digital charged particle detection system for an FIB system. In particular, the digital charged particle detection system provides a two-dimensional image signal of a rastered area, the image signal having good signal to noise ratio when the ion beam current is low. The digital charged particle detection system counts the number of discrete detected charged particles per sub-area of a raster area without any intermediary analog to digital conversion. The counted value will then correspond with an intensity value to be used for generating a display image or graph for the FIB operator or for a post-processing expert system. The digital charged particle detection system includes a detector for sensing a charged particle emitted from a material in response to an incident low current ion beam and a binning circuit for counting the number of detected particles for each sub-area of the raster area.

While the embodiments of the present invention will be described with respect to focused ion beam systems, the embodiments of the invention can be applied to any charged particle beam system that generates an ion or electron beam.

Instead of relying on the amplitude of an analog signal and digitizing it to produce pixels, the pulse counting system and method of the present invention counts individual pulses resulting from detected charged particles as discrete events, where a single event can be set to correspond to any number of individual pulses. These pulses are then accumulated during each pixel dwell point, resulting directly in an integer number usable as an intensity value. According to an alternate embodiment, this system can be configured to be sensitive to amplitudes of the pulses. Since this scheme is insensitive to the actual width of the pulse, each individual event occurring on the detector will result in a single count for the pixel intensity. As such, the system of the present invention is inherently digital in nature and does not suffer the same problems associated with transporting and converting an analog signal into a digital one.

Figure 1:
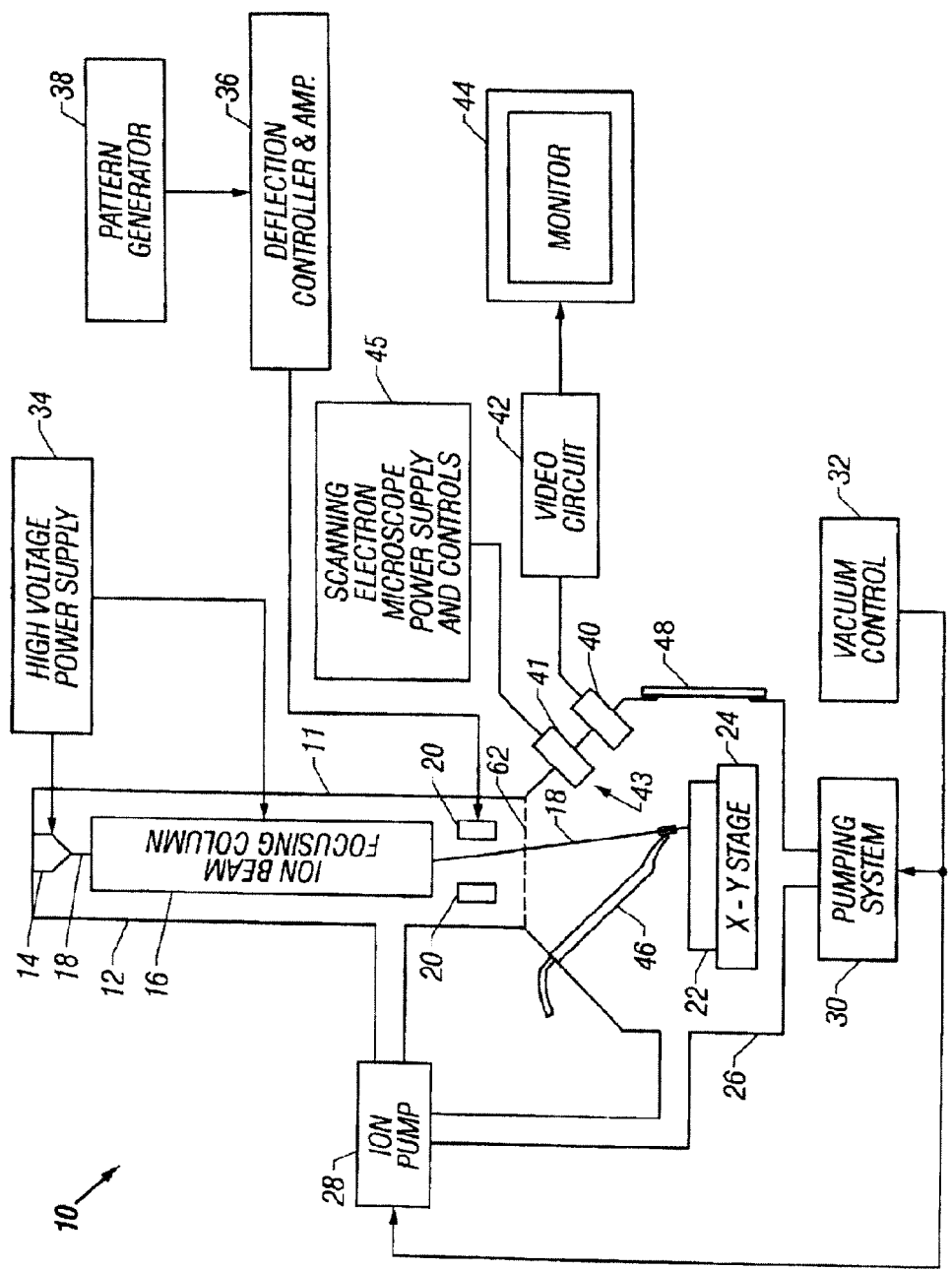
FIG. 1 is a schematic of a FIB system of the prior art.
Figure 4:
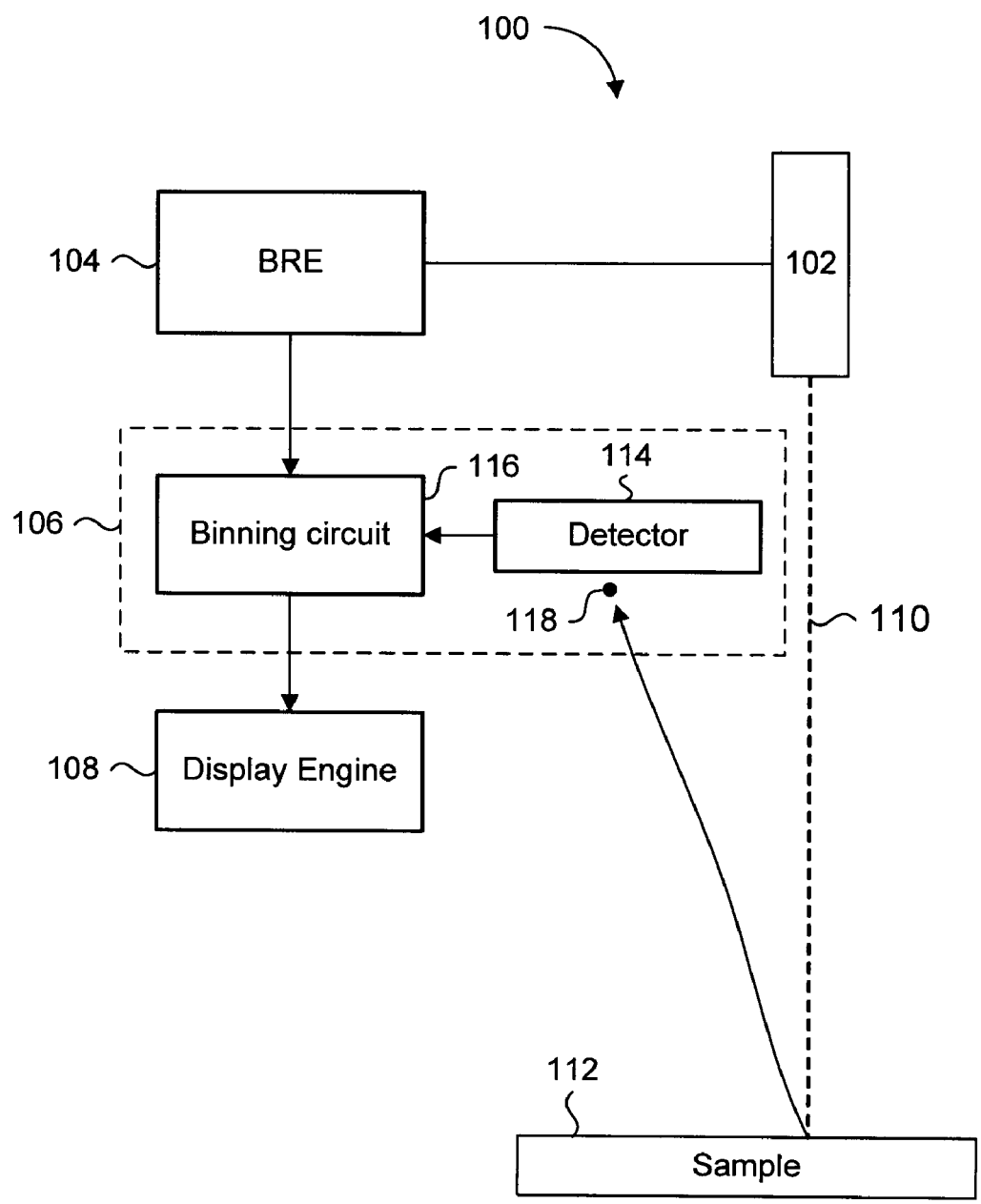
FIG. 4 is a block diagram of a FIB system having a digital charge detection system, according to an embodiment of the present invention.

FIG. 4 is a simplified functional block diagram of an FIB system having the digital charged particle detection system, according to an embodiment of the present invention. FIB system 100 includes FIB column 102, ion beam rastering electronics (IBRE) 104, a digital charged particle detection system 106, and a display engine 108. FIG. 4 only illustrates the components relevant to the embodiments of the present invention, but those skilled in the art will understand that FIB system 100 can include the other components shown in FIG. 1 in order to enable proper operation thereof. FIB column 102 will include elements 12, 14, 16, 18 and 20 shown in the FIB system 10 of FIG. 1, and provides an ion beam 110 directed to a surface of sample 112. IBRE 104 will include the components and circuits for controlling rastering operation of the FIB column 102, and in particular, the ion beam 110. For example, IBRE 104 can set the incident beam current, the raster pattern and dwell time of the ion beam 110 on the sample 112.

The digital charged particle detection system 106 includes a detector 114 and a binning circuit 116. Detector 114 is responsible for generating a discrete electrical signal corresponding to an event, where one event corresponds to the detection of an emitted charged particle 118 from the sample 112. According to embodiments of the present invention, the electrical signal can be a pulse having a range of voltage magnitudes. The electrical signals provided by the detector 114 are provided to the binning circuit 116, which is responsible for counting the number of events which occur during the time period the ion beam dwells in each sub-area of the raster area. The binning circuit is synchronized with the ion beam raster control provided by IBRE 104. As should be known to those skilled in the art, the ion beam is controlled such that it is stepped from one sub-area to another in the raster area in a predetermined pattern, after a preset dwell time for each sub-area has elapsed. Any suitable signaling protocol can be used for achieving this control. Accordingly, the binning circuit 116 is configured to receive the same signals so that it can count and store the number of events detected by detector 114 during the dwell time for one specific sub-area.

Therefore, the binning circuit 116 will store the event count for each sub-area of the raster area, which is then provided to the display engine 108. The event count data can be stored as binary number corresponding to an integer value greater than zero. The display engine 108 will correlate the event count for each sub-area to one or more image display pixels, and convert the event count into a corresponding intensity value. This conversion process can include any type of mathematical post-processing, such as normalizing, to optimize the data for display. The display engine 108 will include a video circuit, amplifier and a monitor for displaying the resulting image data for the FIB operator. In addition to the image, an end-pointing graph can be generated from the intensity values for display. The pixel intensity values used for displaying the image of the raster area can be derived from the intensity values. The resulting intensity data may also be post-processed by an expert system algorithm to determine what instrument settings require modification without operator intervention. The binning circuit 116 can provide the event count data for all sub-areas of the raster area to the display engine 108 after each pass raster area iteration, or the binning circuit can provide the event count data for a prior sub-area as the ion beam steps to the next sub-area.

In an alternate embodiment, the binning circuit can include processing logic to convert the event counts into corresponding intensity values immediately usable by the display engine 108. The functional operation of the circuit blocks shown in FIG. 4 is not restricted to what has been previously described, as the delineation between functions of specific blocks can vary.

The features of detector 114 and binning circuit 116 will now be further described. Detector 114 can be any device sensitive to a single charged particle, and can generate a signal of sufficient magnitude for detection by downstream circuits. A multichannel plate (MCP) detector can be used to detect charged or neutral particles by producing cascades of electrons that are collected at an anode. Photomultiplier tubes (PMTs) that convert photons into a charge pulse by creating successive cascades of electrons can be used as detector 114. In cases where a scintillator is used, incoming charged particles are converted into photons, which are then directed to a PMT for detection. Generally, any detector that produces a cascade effect in which a single particle incident on the detector produces a plurality of secondary particles or photons that can themselves produce additional cascades, can be used. In such embodiments, the photomultiplier detector may have fibre optic cabling for transmitting signal pulses in the form of light to downstream components responsible for converting the light pulses into electrical signal pulses. Persons skilled in the art will understand that not all available detectors are suitable for pulse counting because of noise limitations or the inability to resolve distinct incident particle events, and will be able to select the proper detector that will achieve the desired results taught by the described embodiments.

In all these possible detector implementation examples, a detected particle will result in the generation of a pulse at the output of the detector. Depending on the detector being used, the temporal width of the pulse will be different as will its area (gain) and shape. In some cases, the area of the pulse will also depend on the energy of the incoming particle. Regardless, the generation of a pulse as an indication of a detected particle is all that is necessary.

In a practical implementation of the detector 114, the gain of the detector should be set to a value effective for distinguishing individual events from electronic noise under low beam currents. Furthermore, high bandwidth amplification will be used to preserve individual pulses provided by the detector. Any person skilled in the art will understand that such technical details may be necessary to work the embodiment of the present invention.

Binning circuit 116 will include circuits for sensing pulses provided by the detector 114, counting circuits for keeping track of the sensed pulses, and memory for storing a value corresponding to the counter. The memory can be a discrete device on the same printed circuit board as the other components, or can be embedded in a processing device such as an application specific integrated circuit (ASIC) or processor. The memory can be any circuit that keeps track of the sensed pulses, such as a counter for example. Those skilled in the art will understand that a comparator can be used for sensing a pulse having a minimum voltage magnitude, counters can be used for incrementing a value with each sensed pulse, and embedded or discrete memory of any type can be used to store the binned counter value. The binning circuit 116 can include control logic circuitry for determining when to start and stop counting in response to triggering signals, and other control logic for storing data to memory and for outputting the data from memory. According to an embodiment of the present invention, the binning circuit is implemented with a multi-channel scalar (MCS), also known as a multi-channel analyzer, which is a commercially available product.

An MCS is designed for time-resolved pulse counting, and is adaptable for use in FIB system 100 of FIG. 4. The MCS counts the number of pulses that occur during an interval of time, then moves to the next bin and counts for another interval. The implementation is such that the dwell time for each bin can be internally fixed or triggered by an external signal, and that start and end signals can be asserted to mark the beginning and the end of each pass. In the system of FIG. 4 for example, the external signal can be the signal used by the IBRE 104 for advancing the ion beam to the next sub-area, where each sub-area corresponds to a bin of the MCS. Current MCS boards have large amounts of high speed memory, resulting in 512 k or larger bins and dwell times as low as 100 ns or less. Therefore, by synchronizing the rastering of the beam on the sample surface and the acquisition on the MCS, pulses for a complete rastered frame can be counted. For example, with 512 k bins, the FIB system 100 can linearize a 700×700 image such that each MCS pass corresponds to one rastered frame by using the pixel clock as the bin advance trigger. Advancing a bin can correspond to changing an address location in memory for storing the total number of counted pulses for a sub-area.

Once the bin data stored in the MCS is transferred to a data processor in display engine 108, the bin data can be converted into an image since the position of the beam at each pixel is known in advance. Furthermore, it is also possible to perform frame averaging directly on the MCS card since it has the ability to perform the sum of consecutive passes. Once the integrated frame is collected, the MCS memory can be cleared and a new set of passes can be performed.

Although an MCS board is an existing product that is suitable to serve as the counting and binning device, it is also possible to use a Field Programmable Gate Array (FPGA) device to retrieve and reset the number of events counted by a high speed comparator and counter circuit combination, according to an alternate embodiment of the present invention. In this case, the FPGA is responsible for managing the synchronization signals (frame start, pixel advance, etc.) as well as store the data in memory, or transfer it directly to the display engine 108 for display. The FPGA can also be used to perform any desired preprocessing on the data before it is sent to the display application. In this implementation, the FPGA/counter combination may not provide all the functionality of a commercially available MCS board but will include the functions of counting and binning incoming pulses for the application presented here.

Figure 2:
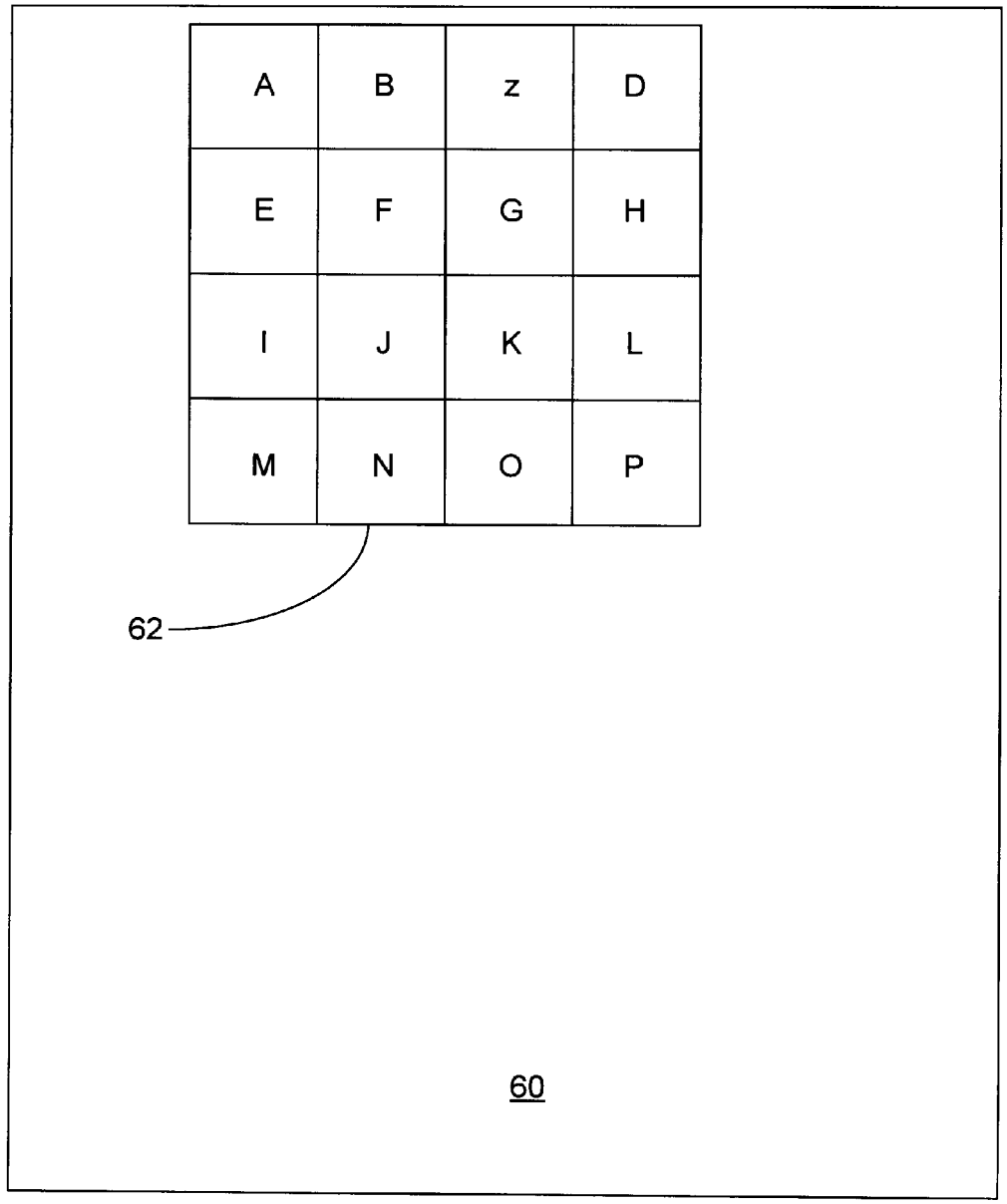
FIG. 2 is a graphical illustration of an example raster area defined by a FIB system.
Figure 3A:
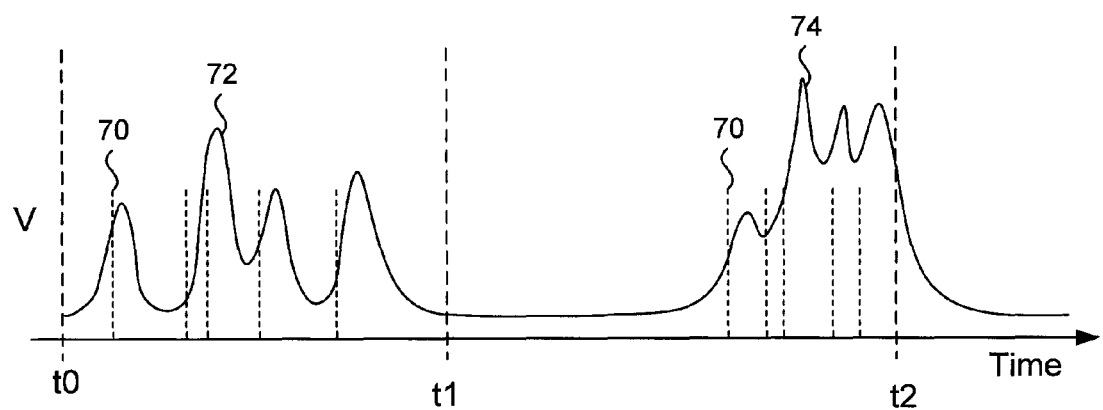
FIG. 3a is a timing diagram showing analog-based charged particle detection of the prior art using an amplifier circuit with high bandwidth amplification.
Figure 3B:
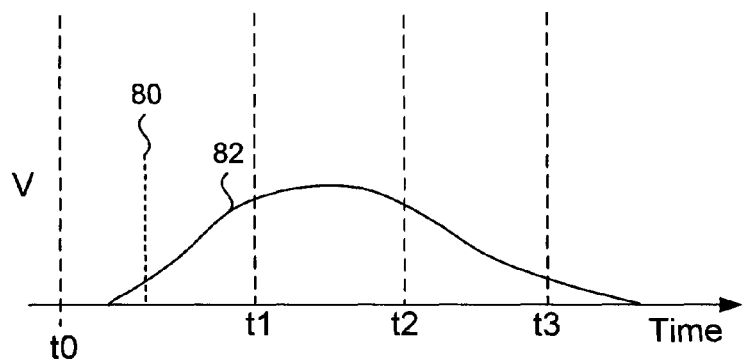
FIG. 3b is a timing diagram showing analog-based charged particle detection of the prior art using an amplifier circuit with low bandwidth amplification.
Figure 5:
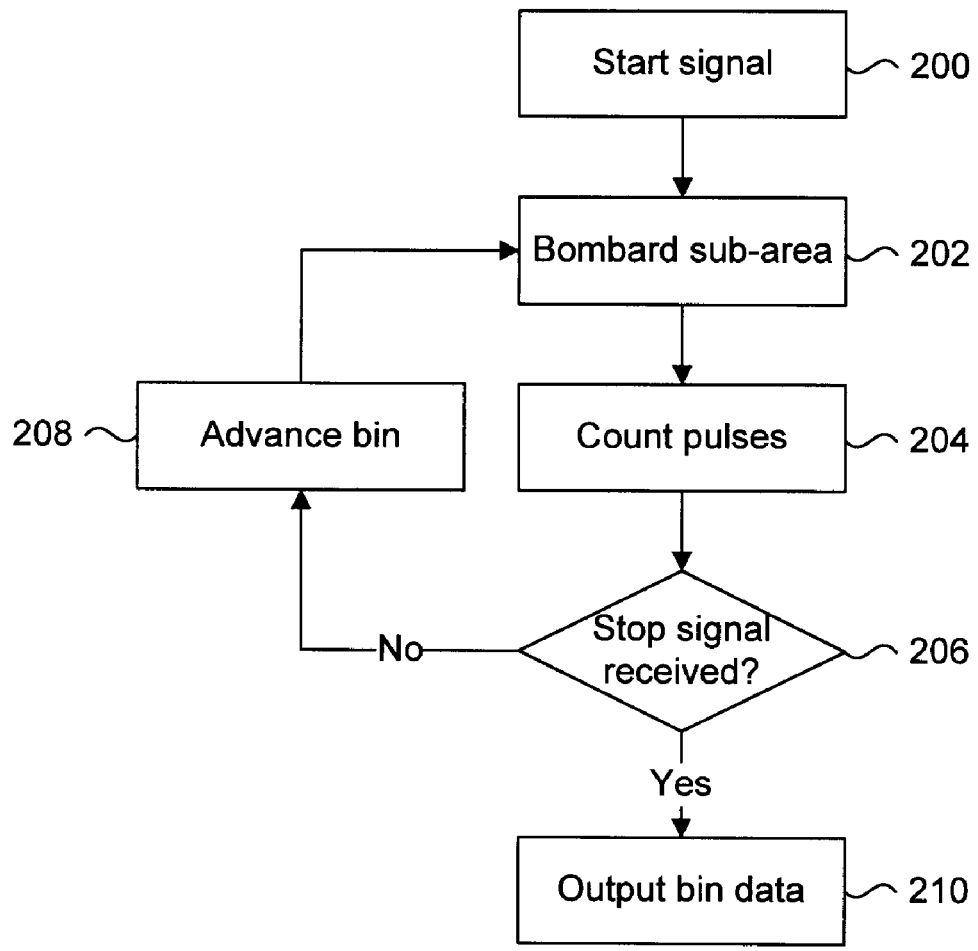
FIG. 5 is a flow chart of a method for digital charge detection, according to an embodiment of the present invention.

An example operation of the FIB system 100 of FIG. 4 is now described with reference to FIG. 2, the flow chart of FIG. 5, and the graphical plot of pulses verses time of FIG. 6. It is assumed that the area to be imaged corresponds to raster area 62 of FIG. 2, where the raster area includes sub-areas A through P. The IBRE 104 has been set to have a raster sequence starting at sub-area A and alphabetically stepping through to sub-area P, with a set ion beam current and dwell time per sub-area. The operation begins at step 200 when IBRE 104 provides a start event to signal the beginning of the raster. At step 202, the ion beam starts bombarding the first sub-area, sub-area A. By example, the dwell time of the ion beam on sub-area A can be 100 ns. At step 204, the detector 114 will detect a number of events and generates corresponding pulses for each detected event. During the dwell time for sub-area A, the binning circuit 116 records each pulse received from detector 114. In the present example, seven events are detected. A determination is made at step 206 to check if a stop signal has been received. If the stop signal is not received, then the bin of the binning circuit is advanced in step 208 and the ion beam is moved to the next sub-area, ie. sub-area B. The loop consisting of steps 202, 204, 206 and 208 continues until the stop signal is received.

In the present embodiment, a triggering signal corresponding to a pixel clock of the IBER 104 can be used to advance the ion beam to the next sub-area, and to control the binning circuit 116 to end counting for the current bin, and restart/reset the counting for the next bin. Those skilled in the art will understand that starting and stopping counting is analogous to enabling and disabling the appropriate circuits. This pixel clock does not need to be uniform in time. In a practical implementation, a delay between the actual IBRE signals and the binning circuit start, stop and channel advance signals can be included to account for the time of flight of the ions down the column and of the charged particles to the detector.

Figure 6:
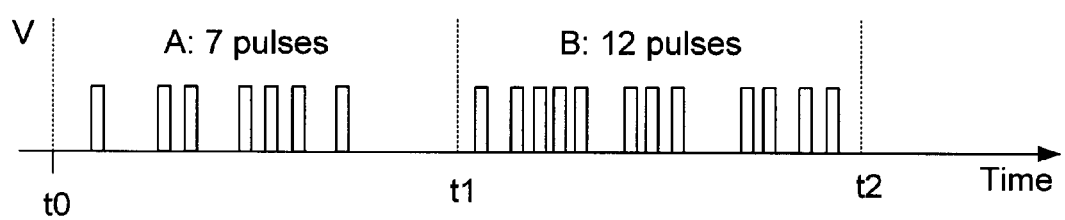
FIG. 6 is a timing diagram showing digital-based charged particle detection using the embodiments of the present invention.

In the example graphical plot of voltage (V) versus time in FIG. 6, detector 114 will have generated seven pulses for sub-area A between times t0 and t1, and twelve pulses for sub-area B between times t1 and t2. The pulses can have any width, and a range of voltage magnitudes, which as previously described, depends on the specific detector being used.

Returning to step 206, if the stop signal is received, then this indicates that the dwell time for the last sub-area P has ended. At step 210, the binned count data can be output to the display engine 108 for further processing and displayed to the user. The process of FIG. 5 can be repeated, as the FIB system will typically pass the ion beam over a raster area multiple times in order to perform a desired circuit edit operation. The present apparatus is configurable to repeat the raster operation of sub-areas A to P any number of times and to integrate the number of pulses detected during each raster operation. The advantage of using an MCS as the binning circuit 116, is that it is configured to allow multiple passes to be accumulated, thereby providing some frame integration corresponding to multiple passes of the ion beam over the raster area.

The previously described embodiment of the invention is effective for low current ion beams, and detection of single charged particles at any one time ejected from the material over a specific duration of time (dwell time). However, a situation may arise in that two or more charged particles are received at substantially the same time by the detector. The previously described detectors generate a pulse having a range in magnitude in response to a single detected charged particle. In certain types of detectors, detection of two charged particles simultaneously will result in the generation of a pulse of the same width, but having a magnitude that exceeds the maximum range of a single event pulse. Therefore, according to another embodiment of the present invention, pulse height discrimination can be used to count the number of events within a dwell time of the ion beam.

Therefore, pulses having a first predetermined magnitude range will count as a single event, while pulses having a second predetermined magnitude range greater than the first predetermined magnitude range will count as two events. The binning circuit 116 can be configured to sense pulses of a first magnitude and a second magnitude. A scheme for sensing pulses of varying magnitudes is now described with reference to FIG. 7.

Figure 7:
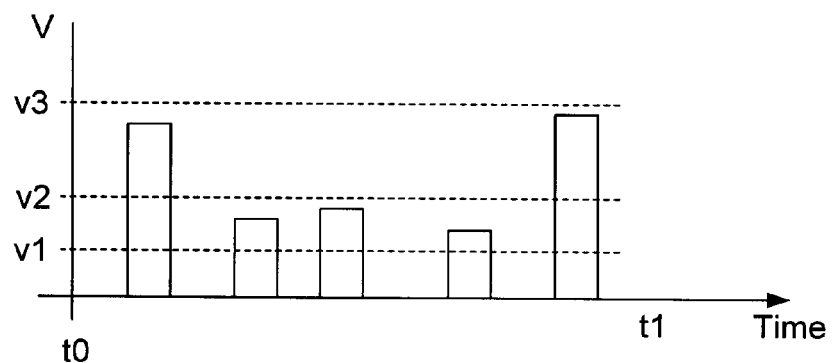
FIG. 7 is a timing diagram showing pulse height discrimination using multiple thresholds, according to an embodiment of the present invention.

FIG. 7 is an example graphical plot of voltage (V) versus time for one sub-area being rastered by an ion beam. It is assumed that the dwell time is between t0 and t1. Single event pulses will have a voltage magnitude within a range of values. Hence, to detect single event pulses, two criteria must be met. The pulse must be greater than a first threshold v1 and less than a second threshold v2. In the example of FIG. 7, there are three pulses that will be sensed as single event pulses. To detect a double event pulse, two criteria must be met. The pulse must be greater than the second threshold v2 and less than a third threshold v3. In the example of FIG. 7, there are two pulses that will be sensed as double event pulses. Therefore, the total number of events counted by the binning circuit 116 will be 7. Persons skilled in the art will understand how to configure sense circuitry for discriminating between pulses having different magnitude ranges. Of course, the system can be scaled to detect pulses having magnitudes corresponding to any number of simultaneous events.

While the previously described embodiments count the number of pulses generated by a detector, those skilled in the art will appreciate that alternate means for counting the pulses can be used. For example, a time-to-digital converter can tag the pulse arrival time, and convert all the tags into a corresponding integer value for a sub-area.

The virtues of performing circuit edit/device modifications with low landing energy primary electrons have been described in commonly owned PCT patent application serial No. CA2006/001816, along with methods for decelerating the electrons that are suitable for circuit edit applications. A similar deceleration approach can be taken with primary ions, which has the virtue of allowing circuit editing to be performed with a reduced implantation depth and straggle of the incident primary ion. Techniques employing primary ion beams with incident landing energies on the order of 200 eV are well known in the SIMS community, but are not yet applied to focused ion beam instruments, particularly for the field of circuit editing where gas delivery is critical. Such techniques can reduce the depth of disruption of the sample by the incident primary beam to scales on the order of one nanometer. These techniques have the disadvantage that they tend to reduce the secondary particle signal intensity that is available, making a pulse counting based method more desirable.

In the above description, for purposes of explanation, details were set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

As described, the present invention provides an apparatus for measuring secondary electrons stemming from a sample, such as an IC, subjected to a ion beam for milling or circuit editing purposes. The apparatus includes a fast detector such as, for example, a multi-channel plate detector coupled to detector electronics connected to a multi-channel scalar time-correlated to ion beam raster electronics. The present apparatus allows for two-dimensional image signal of a raster area, the image signal having good signal to noise ratio even when the ion beam current is low and the ion beam dwell time is short.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A charged particle beam system using a charged particle beam, comprising:
 a beam column for deflecting the low current charged particle beam to raster over a predetermined raster area of the sample in response to control signals;
 beam rastering electronics for generating the control signals,
 a digital charged particle detection system for counting discrete events arising from a number of detected charged particles ejected from the sample during a dwell time on each sub-area of the raster area, the digital charged particle detection system providing intensity values corresponding to the discrete events for each sub-area of the raster area.

2. The charged particle beam system of claim 1, wherein the charged particle beam system is a focused ion beam system, and the low current charged beam is a low current ion beam.

3. The charged particle beam system of claim 1, further including a display engine for receiving the intensity values and for processing the intensity values to generate an image or a graph corresponding to the raster area on a display for modifying a circuit.

4. The charged particle beam system of claim 1, wherein the charged particle detection system includes
 a detector for generating signal pulses corresponding to the number of detected charged particles, and,
 a binning circuit for counting the signal pulses during the dwell time, the binning circuit providing a total count of the discrete events corresponding to each sub-area of the raster area, the discrete events being a function of the counted signal pulses.

5. The charged particle beam system of claim 4, wherein the detector includes a multichannel plate detector.

6. The charged particle beam system of claim 4, wherein the detector includes a photomultiplier tube.

7. The charged particle beam system of claim 4, wherein the detector includes a scintillator for converting the charged particles into photons, and a photomultiplier tube for receiving the photons.

8. The charged particle beam system of claim 4, wherein the binning circuit includes a multi-channel scalar.

9. The charged particle beam system of claim 8, wherein the multi-channel scalar includes bins for storing the total count of the electrical signal pulses corresponding to each sub-area.

10. The charged particle beam system of claim 9, wherein the multi-channel scalar receives the control signals from the beam rastering electronics as a triggering signal for advancing a bin, the control signals being used by the beam column to move the charged particle beam to another sub-area.

11. The charged particle beam system of claim 4, wherein the binning circuit includes
 a first multi-channel scalar for detecting a first signal pulse having a magnitude between a first threshold and a second threshold, the first multi-channel scalar counting the first signal pulse as one count;
 a second multi-channel scalar for detecting a second signal pulse having a magnitude between the second threshold and a third threshold, the third threshold being greater than the second threshold, the second multi-channel scalar counting the second signal pulse as two counts.

12. A method for imaging a raster area of a sample using a charged particle beam system, comprising:
   a) directing a low current charged particle beam onto each sub-area of the raster area for a predetermined dwell time;
   b) counting a number of charged particles ejected from the sample during the predetermined dwell time for each sub-area;
   c) providing intensity values corresponding to the number of counted charged particles for each sub-area of the raster area; and,
   d) generating a display image of the raster area using the intensity values.

13. The method for imaging of claim 12, wherein the steps a) to d) are executed for a circuit modification operation.

14. The method for imaging of claim 12, wherein the step of counting includes
   detecting the number of charged particles,
   generating signal pulses corresponding to the number of charged particles,
   sensing each of the signal pulses, and,
   storing a total number of the signal pulses in a memory bin.

15. The method for imaging of claim 14, wherein the step of storing includes advancing to another memory bin in response to a control signal, the control signal being used by the charged particle beam system to move the charged particle beam to another sub-area.

16. The method for imaging of claim 14, wherein the step of sensing includes
   sensing a first signal pulse having a magnitude between a first threshold and a second threshold, and,
   generating a signal corresponding to a one count when the first signal pulse is detected.

17. The method for imaging of claim 16, wherein the step of sensing further includes
   sensing a second signal pulse having a magnitude between the second threshold and a third threshold, the third threshold being greater than the second threshold, and
   generating another signal corresponding to two counts when the second signal pulse is detected.

18. A digital charged particle detection system for a charged particle beam system, comprising:
   a detector for generating signal pulses in response to one or more detected charged particles ejected from a sample by a charged particle beam; and,
   a binning circuit for counting the signal pulses during a dwell time on each sub-area of a raster area, the binning circuit providing a total count of the signal pulses corresponding to each sub-area.

19. The digital charged particle detection system of claim 18, wherein the detector produces a plurality of secondary particles or photons in response to a charged particle.

20. The digital charged particle detection system of claim 18, wherein the detector includes a multichannel plate detector.

21. The digital charged particle detection system of claim 18, wherein the detector includes a photomultiplier tube.

22. The digital charged particle detection system of claim 18, wherein the detector includes a scintillator for converting the charged particles into photons, and a photomultiplier tube for receiving the photons.

23. The digital charged particle detection system of claim 18, wherein the binning circuit includes
   a comparator circuit for sensing the signal pulses having a minimum threshold level,
   counting circuitry for counting the signal pulses corresponding to each sub-area of the raster area, and,
   memory for storing the total count of the signal pulses corresponding to each sub-area in corresponding logical bins.

24. The digital charged particle detection system of claim 23, wherein the comparator circuit includes
   a first comparator for detecting a first signal pulse having a magnitude between a first threshold and a second threshold, the first comparator generating a signal corresponding to a single count when the first signal pulse is detected,
   a second comparator for detecting a second signal pulse having a magnitude between the second threshold and a third threshold, the third threshold being greater than the second threshold, the second comparator generating another signal corresponding to two counts when the second signal pulse is detected.

25. The digital charged particle detection system of claim 18, wherein the binning circuit includes a multi-channel scalar.

* * * * *